United States Patent [19]

Coy et al.

[11] Patent Number: 4,926,065
[45] Date of Patent: * May 15, 1990

[54] METHOD AND APPARATUS FOR COUPLING AN ECL OUTPUT SIGNAL USING A CLAMPED CAPACITIVE BOOTSTRAP CIRCUIT

[75] Inventors: Bruce H. Coy, San Diego; David S. Rosky, Leucadia, both of Calif.

[73] Assignee: Applied Micro Circuits Corporation, San Diego, Calif.

[*] Notice: The portion of the term of this patent subsequent to May 30, 2006 has been disclaimed.

[21] Appl. No.: 240,136

[22] Filed: Sep. 2, 1988

Related U.S. Application Data

[63] Continuation-in-part of Ser. No. 121,612, Nov. 17, 1984, Pat. No. 4,835,420.

[51] Int. Cl.$^5$ ............................................. H03K 19/01
[52] U.S. Cl. ................................. 307/475; 307/446; 307/455; 307/246; 307/264; 307/482
[58] Field of Search ............... 307/446, 454, 455, 456, 307/475, 482, 494, 246, 264, 549, 296.1

[56] References Cited

U.S. PATENT DOCUMENTS

| | | | |
|---|---|---|---|
| 4,539,493 | 9/1985 | Varadarajan | 307/455 |
| 4,626,709 | 12/1986 | Mazumder et al. | 307/446 X |
| 4,649,294 | 3/1987 | McLaughlin | 307/446 |
| 4,687,953 | 8/1987 | Varadarajan | 307/454 X |
| 4,694,203 | 9/1987 | Uragami et al. | 307/448 X |
| 4,724,343 | 2/1988 | Le Roux et al. | 307/475 |

OTHER PUBLICATIONS

IEEE Journal of Solid State Circuits, Oct. 1989, A 23-ps/2.1-mW ECL Gate with an AC-Coupled Active Pull-Down Emitter-Follower Stage, pp. 1299–1306.

Primary Examiner—David Hudspeth
Attorney, Agent, or Firm—Baker, Maxham, Jester & Meador

[57] ABSTRACT

A method and apparatus for providing ECL output signals to a capacitive load includes differential amplification of input signals with a first output of a differential amplifier connected for establishing a voltage level between voltage limits $V_{cc}$ and $V_{ee}$ at the output of an output driver in response to variations in the first amplifier output. A pull-down transistor has a collector connected to the output driver output, an emitter connected to the $V_{ee}$ voltage source, and a base coupled through a boost capacitor to the second amplifier output. A voltage clamp embracing a clamp transistor with a base connected to receive a predetermined control voltage has an emitter connected to the boost capacitor and the pull-down transistor base and a collector connected to the $V_{cc}$ voltage source. The clamp transistor is operated in Darlington configuration to provide a minimum discharge impedence to the base of the pull-down transistor. A recovery capacitor is connected between the clamp transistor base and the first amplifier output to speed up the clamp transistor's operation.

13 Claims, 3 Drawing Sheets

METHOD AND APPARATUS FOR COUPLING AN ECL OUTPUT SIGNAL USING A CLAMPED CAPACITIVE BOOTSTRAP CIRCUIT

CROSS REFERENCE TO RELATED APPLICATION

This application is a continuation-in-part of Ser. No. 121,612 filed Nov. 17, 1987, and now U.S. Pat. No. 4,835,420.

BACKGROUND OF THE INVENTION

1. Field of the Invention

The present invention relates to high-speed circuits for converting Emitter-Coupled-Logic (ECL) level signals into corresponding Bipolar-CMOS (BICMOS) level signals and more particularly to a method and apparatus for high-speed level conversion employing a capacitively coupled pull-down circuit connected across an output load. The invention further relates to a method and apparatus for generating high speed trailing edge transitions in the output of an ECL circuit which employ a clamped bootstrap driver having an input connected to one output of a differential current switching device through a boost capacitor.

2. Background of the Art

Circuitry used in advanced integrated circuits often employs several different families or types of logic circuits to take advantage of specific operating features or parameters. That is, ECL, TTL, BICMOS, and other types of logic circuits each have inherent operating features in terms of input impedance, power dissipation, voltage levels required, output impedance, etc. that make them well suited to particular switching or logic operations. Therefore, circuits such as ECL logic elements, which are well suited as high speed switching components with low input impedances, are often used in conjunction with TTL circuit elements which drive high current loads, or BICMOS elements which dissipate very little power and provide excellent output impedances.

However, the different logic types or families operate at incompatible signal levels, requiring signal level converters to transfer signals between and through an overall circuit. Therefore, it is necessary to be able to efficiently convert from one signal level, say ECL, to another level, say BICMOS, at high signal transfer rates to take full advantage of the characteristics of the separate circuit elements. Exemplary circuits for accomplishing these type of conversions are shown in U.S. Pat. Nos. 4,453,095, 4,347,446, 4,629,913, and 3,766,406.

A major problem in converting between different types of logic or signal levels is the fact that successive circuit elements or stages often act as large capacitive loads for the converter, especially with BICMOS and TTL circuit elements. This large capacitive load produces signal propagation delays and effects the decay times between signal level transitions. The trailing edges of digital pulse signals become sloped and extended over a longer period instead of having a desired sharp (short period) transition. This causes general signal distortion and processing problems in later stages.

In an attempt to solve the transition problems a pull-down or boost circuit can be employed to assist the converter in removing the charge stored in the large capacitance of the load circuit. One type of pull-down element is shown in U.S. Pat. Nos. 4,629,913 and 3,766,406, where a pull-down transistor is placed across the output load in order to pass current from the load to the lowest circuit potential. However, the pull-down transistors in these inventions continue to draw the pull-down current even after the output falls to a low state. The power dissipated by this extra current is very undesirable.

In U.S. Pat. No. 4,347,446, the pull-down transistor is referenced to an independent voltage source which is controlled to bias the pull-down transistor in the off state when the output signal is in low state. While this decreases the current requirement during the low state period it increases the complexity of the overall circuit and requires a third, programmable, high-current voltage source. This adds complexity and undesirable switching speed complications. This circuit also is incapable of generating both true and complementary outputs simultaneously, which is very important in modern VLSI.

Other techniques have included the addition of resistors and diodes to act as current paths during signal transitions to reduce the voltage inherently stored by the capacitance of current from the output load. However, all of these techniques have proven unsatisfactory in terms of power consumption or undue complexity.

What is needed is a method and apparatus for improving the transition behavior of logic level converters which requires minimum circuit alteration or structure and is very efficient at high signal rates.

More generally, capacitative effects reduce the potential speed at which ECL circuitry can operate, preventing utilization of the full bandwidth capacity of the circuitry. As processing requirements push toward picosecond switching times, every measure must be taken to overcome the hindrances to ECL circuit operation.

SUMMARY OF THE INVENTION

In view of the above summarized problems of the existing art, it is a purpose of the present invention to provide an apparatus and method for converting from one logic signal level to a second logic signal level with faster voltage pull-down response.

A second primary thrust of this invention is to broadly enhance the speed with which an ECL output signal can transition when coupled to a capacitative load.

A distinct advantage of the present invention is the provision of a method and apparatus for improving trailing edge response in circuits employing an amplifier stage having two complementary outputs.

Another purpose of the present invention is to provide an apparatus and method for converting from ECL level signals to BICMOS level signals with improved trailing edge response.

Another advantage of the present invention is that it provides ECL level signal to BICMOS level signal conversion using an efficient circuit design of low complexity.

Yet another advantage of the present invention is found in the provision of improved trailing edge response for signal level conversion while low steady state current loads are maintained.

These and other purposes, objects, and advantages of the present invention are achieved in an apparatus for high-speed provision of Emitter-Coupled-Logic (ECL) signals to a capacitative load. This apparatus includes a differential amplification means for receiving and amplifying input ECL level signals having a first input for the ECL level signals and a second input for a reference signal, and first and second outputs, and being connected to an upper voltage level source $V_{cc}$ and a lower level voltage source $V_{ee}$. An output follower means also connected to the $V_{cc}$ voltage source, is connected to receive an output signal from the first amplification means output in response to variations in amplification output. A bootstrap transistor has a collector connected to the driver output and an emitter connected to the $V_{ee}$ voltage source with a base input coupled through a boost capacitor to the second amplification output.

The boost capacitor provides a high-speed transfer of charge to rapidly turn on the bootstrap transistor during falling signal transitions at the driver output. A low impedance transistor voltage clamp is connected to the bootstrap transistor base for clamping the boost capacitor base to a near-operation voltage level and for rapidly discharging the boost capacitor during rising signal transitions at the driver output.

In further aspects of the invention, a current control means is connected to the differential amplification means and the $V_{cc}$ and $V_{ee}$ voltage sources for limiting the current transferred by the amplification means. The transistor voltage clamp includes a clamp transistor having a base connected to the current control means, an emitter connected to the bootstrap transistor base, and a collector connected to the $V_{cc}$ voltage source. The output follower comprises a transistor having a collector connected to the $V_{cc}$ voltage source and an emitter connected to a driver output, which is coupled to an output load, and a base connected to the first amplification output.

The invention also includes, for rapid operation of the transistor voltage clamp, a transistor connected to the clamp transistor in a Darlington configuration to further reduce the charge transfer impedance for the boost capacitor during rising signal transitions at the driver output. A recovery capacitor is connected between the base of the clamp transistor and the first amplification output to increase the speed of the clamp transistor's operation.

BRIEF DESCRIPTION OF THE DRAWINGS

The novel features of the present invention may be better understood from the accompanying description when taken in conjunction with the accompanying drawings in which like characters refer to like parts and in which.

DETAILED DESCRIPTION OF A PREFERRED EMBODIMENT

The present invention provides a method and apparatus for improving the trailing edge response of ECL logic circuits coupled into substantially large capacitive loads where the logic circuits incorporate at least one differential type amplification stage. The present invention also provides an apparatus and method for converting Emitter-Coupled-Logic (ECL) level input signals to Bipolar-CMOS (BICMOS) level output signals with faster trailing edge voltage level switching resulting in improved output signals. The present invention achieves this by providing a differential current source or signal level amplifier having at least two complementary outputs, one of which is connected to a capacitive load output current driver for generating the appropriate logic level output signals in response to input signals of a different logic signal level. An active current switch is positioned across the output load and has a control input connected through a boost capacitor to the second, complementary, output of the differential amplifier stage. A voltage clamp is connected to the control input to limit the negative excursion of the base of the current switch during a high-to-low transition of the second amplifier output, greatly reducing the recovery time of the circuit. The voltage clamp includes a transistor which both establishes the clamping level and rapidly discharges the boost capacitor.

Figure 1:
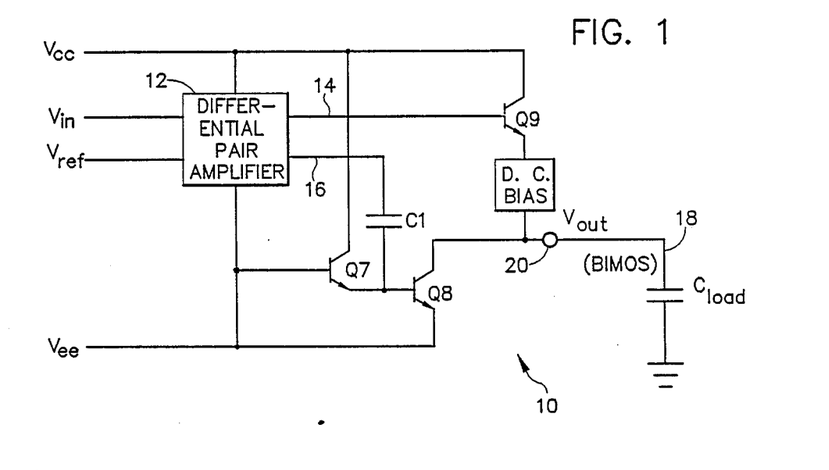
FIG. 1 illustrates a schematic view of an ECL to BICMOS level conversion circuit constructed according to the principles of the present invention.

A method utilized by the present invention to reduce the charge retained by the capacitance of an output circuit load is better described with reference to a basic signal processing circuit as illustrated in FIG. 1. In FIG. 1, an input signal $V_{in}$, such as, but not limited to, an ECL level signal is input to the conversion circuit 10 where it is amplified or buffered using an amplifier circuit 12.

The amplifier 12 is connected between a "high" voltage level source $V_{cc}$ and a "low" voltage level source $V_{ee}$ which also represent the highest and lowest voltage levels obtained by the final output signal, minus voltage drops across switching elements or impedances inherent to a particular output driver. Therefore, $V_{cc}$ and $V_{ee}$ are chosen according to the logic signal level requirements, BICMOS, CMOS, TTL, DTL, etc., for the output of the circuit 10.

The method of the present invention comprises receiving an input signal and amplifying or buffering it at the input signal logic levels to prevent loading the input signal source. This amplified signal is then used to control an output current provided by an output driver at the desired voltage levels. It can be readily seen that this aspect of the method and apparatus is not dependent upon the specific voltage levels chosen for particular logic levels or families but is applicable to a variety of input and output signal voltage levels or logic types.

The amplifier 12 of the converter 10 of FIG. 1 comprises a differential amplifier having two complementary outputs, one of which is generally used to control the flow of current through a subsequent output follower or current driver element Q9. The differential amplifier 12 is a circuit well known in the art of electronics for receiving an input signal at one voltage and current level and increasing the current or voltage level as an output.

One amplifier output, 14, of the amplifier 12 generates a high voltage level output (close to $V_{cc}$) when the voltage level of the input signal $V_{in}$ is higher than a reference input signal $V_{ref}$ and a low voltage level (close to $V_{ee}$) when the input signal $V_{in}$ has a lower voltage than the reference signal $V_{ref}$. A second amplifier output, 16, generates the opposite voltage level, low and high, to the first output 14.

The first amplifier output 14 is connected to an output driver which acts as a current driver for a load circuit 18 connected to the output point 20. A typical output driver comprises an emitter follower transistor, Q9, although more complicated circuitry can be employed. The amplifier output 16 is typically not used in the prior art for driving an output signal. The output driver Q9 is controlled by the output of the amplifier 12 to generate a high level signal in response to a high level present in $V_{in}$ and a low level signal in response to a low level in $V_{in}$ but at the new $V_{cc}$ and $V_{ee}$ signal levels. In this manner an input signal at one logic level is altered to new desired voltage levels.

Figure 3:
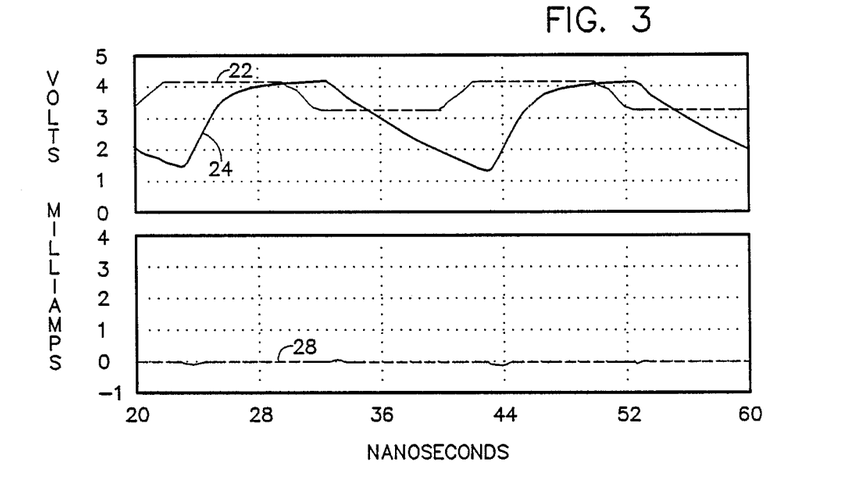
FIG. 3 illustrates typical voltage and current waveforms for input and output signals from the circuit of FIG. 2 without boosting.

However, changes in output current do not bring about immediate changes in the voltage levels seen at the output point 20 because the large capacitance of the load retains charge and creates a longer decay time. The impact of the delay in the decay time for the output voltage is shown in FIG. 3 where a signal in the form of a series of square input pulses 22 are translated into output pulses 24 having sloping edges.

To alleviate this problem, a circuit is applied to the output point 20 in order to discharge the voltage on the capacitive load, that is, to pull down the load quickly. While a simple, passive, impedance element can be added, such an impedance is in the system during all phases of signal conversion or processing. Therefore, this requires more current output from the transistor Q9 and the voltage source $V_{cc}$ to compensate during all phases of the output signal, including steady state voltage levels.

As discussed above, to assist the output current driver Q9 in pulling up or down the voltage of the capacitive load 18, a series of elements such as totem pole diodes or the like can be positioned between the output 20 and $V_{cc}$ or $V_{ee}$. However, these elements either require additional current from the $V_{cc}$ source or independent input voltage sources which are undesirable.

The method of the present invention circumvents these problems by boosting or switching additional current between the output point 20 and the lower $V_{ee}$ voltage source only during the transient level change phase of output pulses so as to assist in pulling down the capacitive load 18. This is achieved by using the complementary output of the differential amplifier 12 to activate a current drain or switch.

For the method of the present invention, an active current switch in the form of a bootstrap transistor Q8 is used to short the capacitive load 18 to the $V_{ee}$ level. The collector of the transistor Q8 is connected to the output point 20 and the emitter to the $V_{ee}$ voltage source. The base of the bootstrap transistor Q8 then receives a signal from the amplifier output 16 to set its operating state, or turn it on and off.

However, it is desirable to have the current switch Q8 activated or conductive only during signal level transitions, and off during steady state signal level output. Therefore, the current switch is capacitively coupled to the output 16 so that only a changing voltage level (transient or transition) on the second amplifier output 16 provides activation of the current switch Q8. This is accomplished by placing a boost capacitor C1 between the output 16 and the base of the transistor Q8.

In this manner only signals during changing levels but not steady state are transferred across the capacitive coupler C1, and only those signals for when the output is dropping. This allows the transistor to be varied in operation to present no current load during steady state operation, that is when the pulse is at its maximum or minimum, but assist in current drain (pull-down) during signal transitions.

To prevent breakdown of the current switch or transistor Q8 and to discharge the boost capacitor C1 for operation during the next transition, a voltage clamp is positioned to provide a fixed minimum voltage to the base of the transistor Q8. A preferred voltage clamp comprises a clamping transistor Q7 having a collector connected to the voltage source $V_{cc}$ and an emitter connected to the base of the transistor Q8. The transistor Q7 receives an input control voltage on its base from a substantially fixed voltage reference source. Other elements can be used to bias the base of the transistor Q8 such as a voltage divider network but an active component is preferred. In addition, as discussed below, other current limiters and DC bias elements can be employed where desired in the converter 10.

Figure 2:
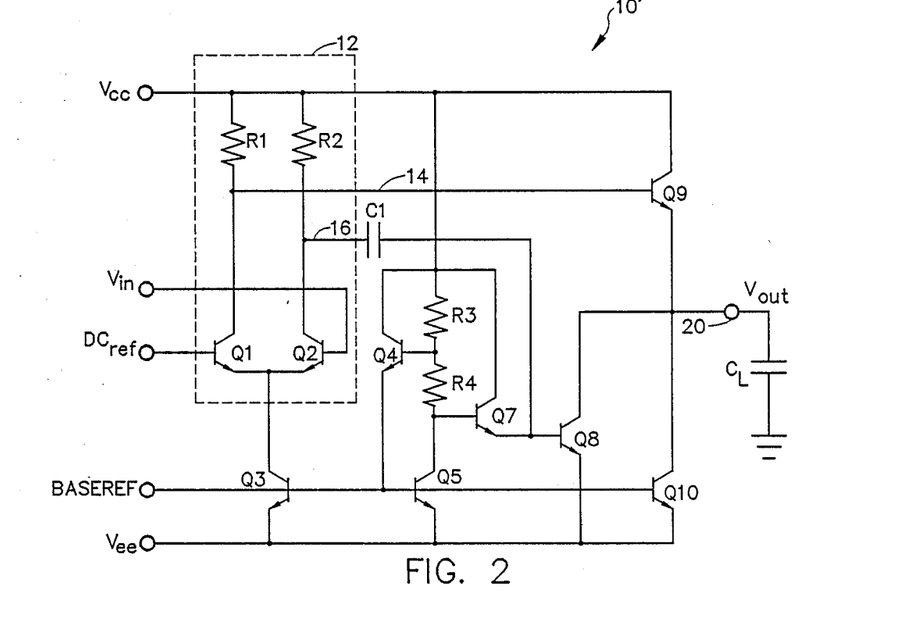
FIG. 2 illustrates one detailed embodiment of the circuit of FIG. 1.

An apparatus constructed according to the principles of the present invention and operating according to the method of the present invention is presented in FIG. 2. FIG. 2 presents a more detailed schematic form of a preferred embodiment of an ECL to BICMOS level conversion circuit 10' implementing the inventive elements shown in FIG. 1. However, the specific signal levels employed, as well as circuit functions are for purposes of illustration and it will be readily understood by those skilled in the art that alterations can be made without departing from the teachings of the present invention.

In FIG. 2, a pair of transistors, Q1 and Q2 have their emitters connected together to form the differential amplifier or current switch 12 in which only one transistor conducts at any time, that being the one with the higher base potential. For ease of illustration the transistors Q1 and Q2 are illustrated as standard NPN transistors although other types of transistors, such as FETs, PNPs, etc., can also be employed in particular applications.

The emitters of these transistors are connected to a current source Q3 which is connected to $V_{ee}$, the negative or low potential voltage source for the converter 10'. The collectors of the transistors Q1 and Q2 are connected through the resistors R1 and R2, respectively, to the voltage source $V_{cc}$ which is the upper level voltage limit for the converter 10'. The resistors R1 and R2 determine the variation or swing in voltage provided as an output from the pair by providing a voltage drop from the $V_{cc}$ level.

The voltage source $V_{cc}$ typically comprises a well regulated voltage source delivering voltages in the range of about $-0.7$ to $+5.1$ volts, depending on the type of logic signals being output, at currents determined by power consumption restrictions imposed on the converter 10' and associated circuits. The voltage source $V_{ee}$ typically comprises a well regulated voltage source delivering voltages in the range of about $-5.2$ to $0.0$ volts. A typical BICMOS output requires a voltage in the range of about $-0.2$ to $0.0$ volts for $V_{cc}$ and between about $-5.2$ and $-5.0$ for $V_{ee}$. However, the specific voltages and currents depend on known design requirements for either the input or load circuits and are altered for specific applications.

The emitters of the transistors Q1 and Q2 are preferably connected to the lower voltage level source, $V_{ee}$, through a current control transistor Q3. Transistor Q3 acts as a constant current source for the transistors Q1 and Q2 and limits the amount of current the transistors Q1 and Q2 pass which in turn limits the current output to subsequent circuit stages as well as preventing undue loading of the voltage sources $V_{cc}$ and $V_{ee}$.

A pair of transistors Q4 and Q5 form a current reference for the differential pair Q1, Q2 and the output driver Q9. These two transistors regulate the current allowed by transistor Q3. Transistor Q4 has a collector connected to the voltage source $V_{cc}$, an emitter connected to the base of transistors Q3, Q5 and Q10 and a base connected to a pair of resistors R3 and R4. The resistors R3 and R4 are placed between the base and collector of transistor Q4 and between the base of Q4 and the collector of the transistor Q5 and form a voltage divider network. These resistors bias the transistor Q4 to provide a predetermined output voltage on the transistor emitter to control current limits of the transistors Q3 and Q5.

The differential amplifier pair 12 provides an output based upon the differential in the input level between the bases of the two transistors Q1 and Q2. That is, when the levels at their respective bases differ there is a "high" level output produced at one of the two transistor collectors depending on which base voltage is larger. By assigning the input signal $V_{in}$ to one transistor base and a DC reference voltage to the second transistor base, an output signal is generated on the collector of the second transistor whose state or level is dependent on whether the input signal voltage is higher or lower than the reference. The DC reference voltage represents a threshold level which the input signal $V_{in}$ must exceed before an output signal results from the collector of the second transistor of the differential pair.

In the preferred embodiment, the base of Q1 is connected to a fixed reference voltage $DC_{ref}$ which is approximately $2V_{be}$ where $V_{be}$ is the diode potential across the base-emitter portion of the transistor Q1. The base of Q2 receives a level shifted ECL input which is generally symmetrical about the $DC_{ref}$ voltage level. The current in the differential pair is chosen such that the collector of Q1 swings from $V_{cc}$, minus the R1 voltage drop, when Q1 is off and Q2 is on, to $V_{ee}+2V_{be}$ when Q1 is on and Q2 is off.

The input signal $V_{in}$ activates the transistor Q1 only if it drops below $V_{ee}+2V_{be}$. This turns transistor Q2 off and Q1 on and passes current between the $V_{ee}$ and $V_{cc}$ voltage sources. The end of the resistor R1 connected to the collector of the transistor Q1 experiences a drop in voltage level until it obtains the steady state value of $V_{ee}+2V_{be}$. When the input signal exceeds the value $V_{ee}$ by $2V_{be}$ the transistor Q2 turns on and the transistor Q1 turns off. The voltage of the Q1 collector rises until it reaches a maximum or steady state output value of $V_{cc}-R1I1$, where I1 is the base and leakage current through the resistor R1.

The converter 10' output is provided by a level shifter or output follower transistor Q9 which acts as a current driver for the load 18 and passes current from the higher voltage source $V_{cc}$ to the load and to the lower voltage source $V_{ee}$. The transistor Q9 has a collector connected to the voltage source $V_{cc}$ and an emitter connected to a converter 10' output point 20'. The output of the emitter follower Q9 varies from $V_{cc}-V_{be}$ when Q1 is turned off to $V_{ee}+V_{be}$ when Q1 is turned on, which represents the required BICMOS output level used.

The output point 20 is preferably maintained at a DC bias level above $V_{ee}$ by one of several means. While a resistor can be employed, it is more advantageous to use a transistor to obtain the proper DC bias level. In the preferred embodiment, a transistor Q10 is employed with a collector connected to the output point 20 and an emitter connected to the $V_{ee}$ voltage source. The base of the transistor Q10 is connected to the emitter of the transistor Q4 which drives the current source Q3 and sets a predetermined constant current in the collectors of the transistors Q3 and Q5.

Variations in the the input ECL signal level changes the voltage at the collector of the transistor Q1 which alters the current flow through the output follower or level driver transistor Q9. This in turn alters the current and voltage provided across the output 20. A rise in the ECL pulse to its maximum, steady state, level also causes the output level of the converter 10' to rise to its maximum steady state output level. When the ECL signal level decreases, the output level of the converter 10' also decreases to a low steady state level.

However, as before, charge stored in the parasitic or inherent capacitances of the load circuit 18 prevents the output of the converter 10' from making a fast transition from high to low voltage levels. The output follower Q9 does not provide an adequate current drain to remove the excess charge.

The transistor Q9 exhibits good pull-up capability with the output load 18 because of the transistor beta and the ability to draw on the current of the $V_{cc}$ source to charge the capacitance of the load. However, the only current available to pull the output voltage down is the bias current provided by Q10. Since this is normally a DC referenced current source no beta amplification is available and the current provided is limited to that of the bias source. As previously discussed, it is undesirable to make the DC bias current large in order to handle this pull-down requirement since this represents an increased current level that is always present, even when the output signal is not switching levels.

In order to solve the above problem, a transistor Q8 is used to provide additional pull-down current when required during switching without consuming extra DC bias current during steady-state. The collector of the transistor Q8 is connected to the output point 20 or, in this application, the emitter of the transistor Q9 and its emitter to the $V_{ee}$ supply. This arrangement provides a current path directly between the output point 20 and the $V_{ee}$ voltage level. The base or current control for the transistor Q8 is coupled to the second output of the transistor pair, or the collector end of the transistor Q2. This means that when the transistor Q2 is off or not conducting, the transistor Q8 base is raised above the $V_{ee}$ level which turns the transistor Q8 on and creates a current drain or path between the output 20 and the low potential $V_{ee}$.

However, this current switch is only desired for transitions and not steady state operation. Therefore, the base of the transistor Q8 is connected to the collector of the transistor Q2 through a boost capacitor C1. The effect of this capacitive coupling is that only varying voltage levels at the collector of the transistor Q2 will be transferred to the base of the transistor Q8. This occurs only when the signal at the input drops below the $DC_{ref}$ level which occurs during down-going transitions. When the circuit is at a steady state level, that is, either Q1 or Q2 are on and the voltages at R1 and R2 are unchanging, then no signal crosses C1. During steady state operation, the voltage at the transistor Q2 collector does not transfer across the capacitance and the base of the transistor Q8 remains unchanged and no current flows through the transistor Q8 from the output point 20.

When the collector voltage of the transistor Q2 rises and the transistor Q1 collector voltage is falling and the output voltage from Q9 is also falling, a displacement current flows through the capacitor C1 and to the base of Q8. This current is amplified by the transistor Q8 and aids in quickly discharging the load 18 capacitance $C_L$.

At the same time, the base of the transistor Q8 is connected to the emitter of a transistor Q7 which is used as a voltage clamp for the base of the transistor Q8. The transistor Q7 has a collector connected to the $V_{cc}$ voltage source and a base connected to the current limiter transistor Q5 to provide a fixed voltage level at the base of the transistor Q8. The transistor Q7 acts as a voltage clamp by discharging capacitor C1 during the falling edge of the transistor Q2 collector (rising $V_{out}$). This limits the voltage swing at the base of Q8 and ensures that C1 is ready on the next signal transition to provide displacement current on the next rising edge of the collector voltage for the transistor Q2.

Figure 4:
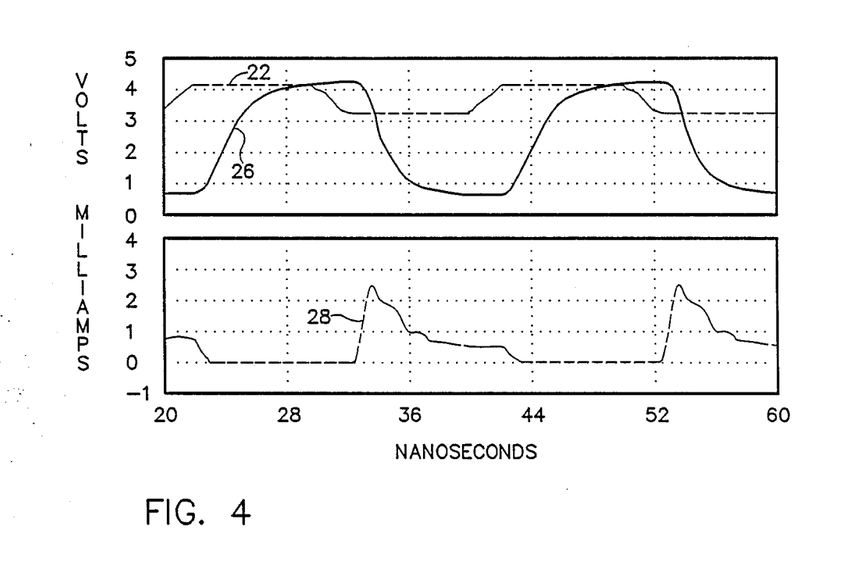
FIG. 4 illustrates typical voltage waveforms for output signals corresponding to FIG. 3, and typical current waveform for current in the boost portion of the circuit of FIG. 2 during output.

The results of employing the transistors Q7 and Q8 in combination with the capacitor C1 are seen in FIG. 4 where input and output waveforms are illustrated. In FIG. 4, an input ECL level signal shown as waveform 22 is converted to the output BICMOS level waveform 26. The current transferred though the transistor Q8 is illustrated as the waveform 28 and shows the rapid response of the current drain for the output as well as the quick shut off for steady state operation.

Figure 5:
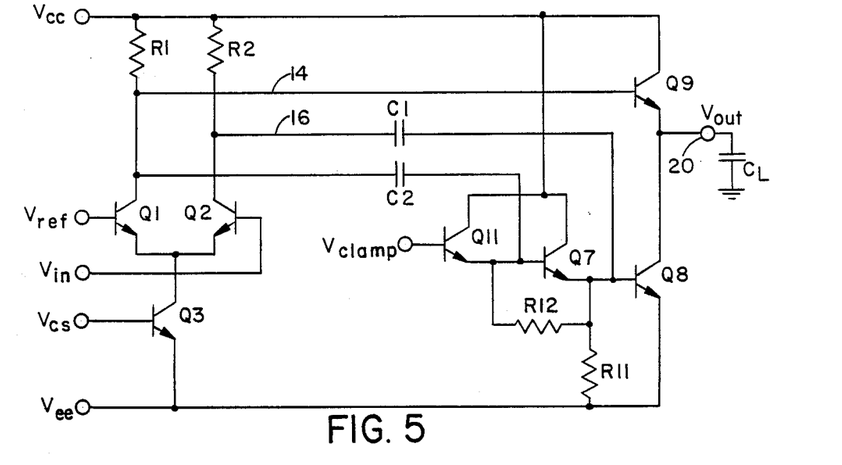
FIG. 5 illustrates the connection of a Darlington transistor and a recovery capacitor to the circuit of FIG. 1.

The operation of the clamped, capacitative bootstrap circuit of FIG. 1, consisting of clamp transistor Q7, bootstrap transistor Q8, and boost capacitor C1 can be speeded up by employment of circuitry which lowers the conductive impedance of the clamp transistor Q7, and increases its switching speed. This circuitry is illustrated in FIG. 5. FIG. 5 illustrates a Darlington circuit including a transistor Q11 and biasing and resistors R11 and R12 connected in the well-known Darlington configuration to the clamp transistor Q7. As is known, the Darlington configuration reduces the effective output impedance of transistor Q7, thereby reducing discharge impedance provided by the transistor when discharging the boost capacitor C1. Although this impedance is low in the circuits of FIGS. 1 and 2, it is not exactly zero. Therefore, the voltage at the emitter of Q7 (which is also at the base of the bootstrap transistor Q8) will be somewhat lower than its quiescent DC value during the discharge of the boost capacitor C1. As a result, if another negative transition in the output signal at the node 20 appears before the voltage at the base of the bootstrap transistor Q8 has fully recovered, Q8 will have a slightly longer delay in turning on than under normal conditions, resulting in a delay of the gate of FIG. 1. This is undesirable since the delay of the gate is now a function of signal frequency.

Figure 6:
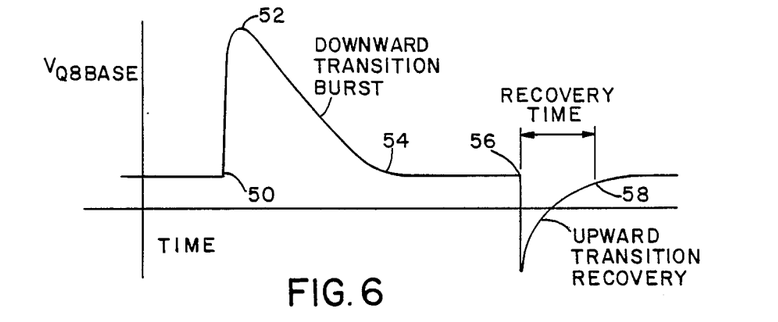
FIGS. 6 and 7 illustrate the operation of a bootstrap transistor in the circuit of FIG. 1 without and with the connection of FIG. 5.

The recovery time of Q8, without the Darlington circuit of FIG. 5 is illustrated in FIG. 6, which shows the voltage waveform at the base of the transistor Q8. During a negative transition of the output signal at the node 20, the voltage at the collector of Q2 makes a positive transition which is coupled through boost capacitor C1 to the base of transistor Q8. This initial transition is indicated by reference numeral 50 in the waveform of FIG. 6. In response to this transition, the transistor Q8 turns on and continues to conduct while the voltage on the boost capacitor C1 decays as shown in the portion of the FIG. 6 waveform between reference numerals 52 and 54. When the base voltage on the boost capacitor decays to the forward biasing voltage of the transistor Q8, the transistor is only slightly on. Next, when the output voltage at the node 20 makes a positive transition, the collector voltage of transistor Q2 falls. This causes a negative-going voltage transition to be coupled through the boost capacitor C1 to the base of the transistor Q8 at the point indicated by reference numeral 56 of FIG. 6. At this point, the forward current through the clamp transistor Q7 permits a transfer of charge on the boost capacitor C1, which causes the capacitor's voltage to transition positively. Voltage on the capacitor recovers to a level just below the forward conduction point of the transistor Q8. The time required to discharge the boost capacitor to this point is indicated as "recovery time" in FIG. 6. It should be obvious that if a positive transition is coupled through the boost capacitor C1 to the base of the transistor Q8 during this recovery time, the transistor will delay in turning on until the voltage on the capacitor recovers sufficiently.

In order to provide even faster recovery than afforded by the clamped capacitative bootstrap circuit of FIGS. 1 and 2, the Darlington transistor Q11 and recovery capacitor C2 are added. The capacitor C2 is connected between the first amplifier output 14 and the base of the clamp transistor Q7. Darlington transistor Q11 provides a reduced impedance at the base of the clamp transistor Q7, improving its low impedance characteristics and the "stiffness" of the clamp. The Darlington transistor Q11 is connected at its collector to $V_{cc}$ and at its base to a clamp voltage V clamp having a magnitude of about 3 $V_{be}$. This voltage can be obtained, for example, from between R3 and R4 in FIG. 2, with appropriate values selected from those resistors. The magnitude of V clamp keeps Q7 and Q11, turned on throughout the operation of the ECL pair Q1 and Q2, and keeps Q8 biased to a low level of forward conduction. In this latter regard, the emitter voltage of Q7 still "clamps" the base of Q8. When a positive-going voltage is delivered from the collector of Q2 to the base of Q8 through boost capacitor C1, Q8 immediately "turns on" completely, and conducts for so long as the charge on C1 keeps the base voltage of Q8 at or above $V_{be}$. At the same time, Q7's forward conduction immediately begins to discharge C1.

The recovery capacitor C2 connected between the first amplifier output 14 and the base of Q7 also assists in reducing the negative spike of FIG. 6 by providing a capacitative "tug" to the base of the clamp transistor Q7, which is designed to be equal and opposite to the "tug" that the boost capacitor C1 provides to the emitter of the clamp transistor Q7. In this regard, when the output level at the output node 20 changes in the positive direction, voltage on the collector of transistor Q1 rises, with a positive transition of this rising voltage coupled through the recovery capacitor C2 to the base of the clamp transistor Q7, which increases the emitter current of the clamp transistor Q7 and increases the rate at which the boost capacitor C1 is discharged.

Figure 7:
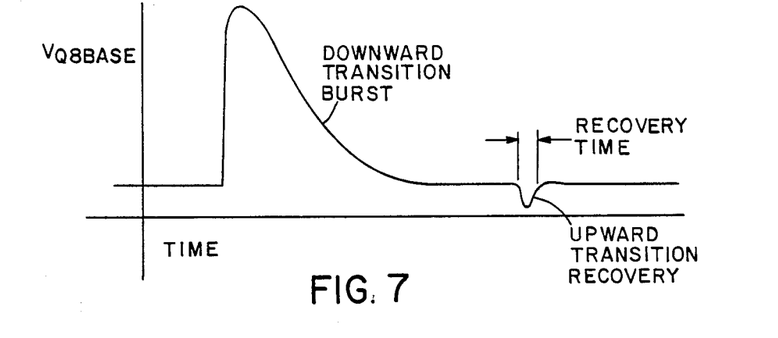

The cumulative effect of the recovery capacitor C2 and Darlington transistor Q11 is illustrated in FIG. 7, where the recovery time for the voltage at the base of the bootstrap transistor Q8 is significantly reduced, when compared to FIG. 6.

What has been described then is a new capacitively coupled voltage pull-down circuit for improving the transition or switching response of the output for various circuits employing a differential amplification stage.

The foregoing description of preferred embodiments has been presented for purposes of illustration and description. It is not intended to be exhaustive nor to limit the invention to the precise forms disclosed, and many modifications and variations are possible in light of the above teaching. The embodiments were chosen and described to best explain the principles of the invention and its practical application to thereby enable others skilled in the art to best utilize the invention in various embodiments and with various modifications as are suited to the particular use contemplated. It is intended that the scope of the invention be defined by the claims and their equivalents.

What I claim as my invention is:

1. An apparatus for converting input signals at Emitter-Coupled-Logic (ECL) levels to output signals at corresponding Bipolar-CMOS (BICMOS) levels, comprising:
   a $V_{cc}$ voltage source;
   a $V_{ee}$ voltage source;
   differential amplifier means with a first and a second output for amplifying the current level of said input signals and for producing at said first output a first output signal representing said amplified current level and for generating at said second output a second output signal representing the complement of said first output signal;
   a capacitive driver output;
   output driver means connected to said $V_{cc}$ voltage source and to said first output, for shifting said first output signal to a voltage level between $V_{cc}$ and $V_{ee}$ and providing said shifted first output signal at said capacitive driver output;
   a bootstrap transistor having a base, a collector connected to said driver output, and an emitter connected to said $V_{ee}$ voltage source;
   boost capacitive transfer means connecting said bootstrap transistor base to said second output for causing said bootstrap transistor to conduct current to discharge said capacitive driver output in response to variations in said second output signal; and
   voltage clamping means connected to said bootstrap transistor base for establishing a predetermined voltage level at said bootstrap transistor base.

2. The apparatus of claim 1 further comprising current control means connected to said differential amplifier means, and to said $V_{cc}$ and $V_{ee}$ voltage sources, for limiting said current level.

3. The apparatus of claim 2, wherein said voltage clamping means comprises a clamp transistor having an emitter connected to said bootstrap transistor base, a collector connected to said $V_{cc}$ voltage source, and a base connected to said current control means.

4. The apparatus of claim 2 wherein said current control means comprises:
   a voltage divider, comprising a first resistor connected to said $V_{cc}$ voltage source on one end, and a second resistor connected in series with said first resistor, a first end of said second resistor being joined to a second end of said first resistor at a junction;
   a first current transistor having a collector connected to a second end of said second resistor and an emitter connected to said $V_{ee}$ voltage source;
   a second current transistor having a collector connected to said $V_{cc}$ voltage source, a base connected to said junction, and an emitter connected to a base of said first current transistor; and
   a control transistor having a base connected to said first current transistor base, a collector connected to said differential amplifier means, and an emitter connected to said $V_{ee}$ voltage source.

5. The apparatus of claim 1 further comprising DC bias means connected between said capacitive driver output and said $V_{ee}$ voltage source for establishing a predetermined minimum voltage level at said capacitive driver output.

6. The apparatus of claim 1, wherein:
   said boost capacitative transfer means is a boost capacitor connected between said second output and said bootstrap transistor base; and
   said clamping means is a clamp transistor having an emitter connected to said bootstrap transistor base and said boost capacitor, a collector connected to said $V_{cc}$ voltage source, and a base; said apparatus further including:
   recovery capacitative means connecting said clamp transistor base to said first output for causing said clamp transistor to conduct to transfer charge on said boost capacitor in response to variations in said first output signal; and
   bootstrap means connected to said clamp transistor base for reducing the discharge impedance presented by said clamp transistor to said boost capacitor.

7. A method of depleting the charge accumulated in the capacitance of a load connected to an output node of an ECL circuit, said ECL circuit including a current switching stage having complementary output nodes and a bootstrap portion connected to said output node for discharging said capacitance, comprising the steps of:
   generating ECL circuit output signals at said output node in response to a first signal at a first complementary node, said output signals including rising transitions which charge said capacitance, and falling transitions;
   capacitative conducting a second signal, complementary to said first signal, from a second complementary node to said bootstrap portion, said second signal including rising transitions corresponding to the falling transitions of said first signal;
   operating said bootstrap portion to discharge said capacitance in response to the rising transitions of said second signal; and
   at said bootstrap portion, clamping the voltage level at which said second signal is capacitatively conducted and then capacitatively conducting a discharge current from said bootstrap portion to said second node.

8. An ECL output circuit for coupling to capacitative loads, comprising:
   a differential amplifier with first and second outputs for producing a first output signal at said first output and a second output signal at said second output, said first output signal being substantially the complement of said second output signal;
   an output emitter follower having an input connected to said first output, and a circuit output;

a bootstrap circuit connected to said circuit output for conducting a discharge current from said circuit output;

a boost capacitor connected between said bootstrap circuit and said second output; and a voltage clamp transistor circuit connected to said boost capacitor and said bootstrap circuit for establishing a voltage level for bootstrap circuit operation and for discharging said boost capacitor.

9. The ECL output circuit of claim 8, further including:

a recovery capacitor connected between said voltage clamp transistor circuit and said first output; and a Darlington transistor circuit connected to said voltage clamp transistor circuit and to said recovery capacitor.

10. The ECL output circuit of claim 9 wherein said voltage clamp transistor circuit includes a clamp transistor having an emitter connected to said bootstrap circuit, a collector for voltage source connection, a base, and a clamp voltage source connected to the base.

11. The ECL output circuit of claim 10 wherein said recovery capacitor has a first connection to said first output and a second connection to the base of said clamp transistor.

12. The ECL output circuit of claim 11 wherein said Darlington transistor circuit includes a Darlington transistor having an emitter connected to the base of said clamp transistor, a collector for voltage source connection, a base, and a clamping voltage source connected to said base.

13. The ECL output circuit of claim 10 wherein said recovery capacitor has a first connection to said first output and a second connection to said clamp transistor circuit and to said recovery capacitor.

* * * * *

UNITED STATES PATENT AND TRADEMARK OFFICE
CERTIFICATE OF CORRECTION

PATENT NO.   :   4,926,065

DATED        :   May 15, 1990

INVENTOR(S)  :   Coy et al

It is certified that error appears in the above-identified patent and that said Letters Patent is hereby corrected as shown below:

Col. 12, line 47, please change "capacitative" to --capacitatively--.

Signed and Sealed this

Twentieth Day of August, 1991

*Attest:*

HARRY F. MANBECK, JR.

*Attesting Officer*         Commissioner of Patents and Trademarks